United States Patent [19]

Held

[11] Patent Number: 4,567,130
[45] Date of Patent: Jan. 28, 1986

[54] PROCESS FOR ETCHING SINGLE PHOTOPOLYMER LAYER UTILIZING CHEMICALLY SOLUBLE PIGMENTS

[75] Inventor: Robert P. Held, Englishtown, N.J.

[73] Assignee: E. I. Du Pont de Nemours and Company, Wilmington, Del.

[21] Appl. No.: 635,348

[22] Filed: Jul. 27, 1984

[51] Int. Cl.$^4$ .................. G03C 1/68; G03C 5/16; G03F 9/00
[52] U.S. Cl. .................................. 430/294; 430/6; 430/273; 430/325; 430/331; 430/270; 156/659.1; 156/661.1
[58] Field of Search ............... 430/6, 294, 273, 325, 430/331, 270; 156/659.1, 661.1

[56] References Cited

U.S. PATENT DOCUMENTS 3,415,698 12/1968 Hellmig et al. .................. 430/6
4,173,673 11/1979 Bratt et al. ..................... 428/217

Primary Examiner—John E. Kittle
Assistant Examiner—Cynthia Hamilton

[57] ABSTRACT

Process for preparation of dot-etched photopolymerizable lithographic film which comprises (a) exposing imagewise a photopolymerizable element consisting essentially of a support and a layer of caustic soluble photopolymerizable composition having dispersed therein a chemically soluble pigment, e.g., iron oxide, and optionally an overcoat layer; (b) developing the exposed element with caustic solution; and (c) treating the developed element with a chemical solubilizing agent for the pigment. A lithographic film is prepared.

10 Claims, 3 Drawing Figures

PROCESS FOR ETCHING SINGLE PHOTOPOLYMER LAYER UTILIZING CHEMICALLY SOLUBLE PIGMENTS

DESCRIPTION

1. Technical Field

This invention relates to a process for the preparation of a dot-etched lithographic film. More particularly this invention relates to a process for the preparation of a dot-etched lithographic film having a caustic soluble photopolymerizable layer with a chemically soluble pigment dispersed therein.

2. Background Art

In the photomechanical trades, a mask containing an image that is opaque to actinic radiation is used in preparing a printing plate of some kind, e.g., letterpress, lithographic, etc. The mask is used as a phototool in exposing a layer of photosensitive resist-forming material present on a metal or plastic plate or a photopolymer printing plate matrix. After the exposure the printing plate is formed by etching or liquid development depending on the system present. The image in the mask must be of the highest possible contrast, e.g., completely opaque black in the image areas, and completely transparent (free from fog) in the unexposed areas. Silver halide film known as "litho" film is used to prepare the mask. When a litho film is exposed through a halftone screen and developed, it contains an image comprised of dots. The dots correspond to the areas of the film under the transparent areas of the halftone screen and are comprised of exposed and developed material. In silver halide litho film, these dots may be reduced in size by a process referred to as "dot-etching", i.e., reducing the size of, or "etching" the halftone dots, thereby changing the tone values of the image. In silver halide films dot-etching is accomplished chemically by treating the films with a silver "solvent". Silver halide films are expensive and require special red light handling.

Bratt and Cohen in U.S. Pat. No. 4,173,673 claim a dot-etchable mask prepared by imagewise exposure of a photopolymerizable element which comprises a support bearing a photopolymerizable layer having an optical density in the actinic region of at least 3.0 and having a thickness no greater than 0.015 mm. A removable cover sheet or a soluble overcoat layer can be present on the photopolymerizable layer. After the exposure through a halftone screen, the polymerized dots have a hardened upper skin which rests on softer undervolume having a lesser degree of polymerization or hardening. The dots are reducible in size by undercutting the polymeric dots with a solvent for the softer undervolume and removing hardened polymer from the edges of the hardened upper skins by mechanical action on the image bearing surface of the mask. The dot-etching of photopolymerizable element as described above requires the proper balance of the imagewise exposure and the undercutting of the polymeric dots with a solvent and mechanical action on the image bearing surface of the mask.

It is therefore desirable to provide a process whereby a dot-etched photopolymerizable lithographic film is prepared which does not require solvent undercutting of the polymerized image or dots as well as the use of mechanical action on the image or dots.

BRIEF DESCRIPTION OF DRAWING

In the accompanying drawing forming a material part of this disclosure.

DISCLOSURE OF THE INVENTION

Figure 1A:
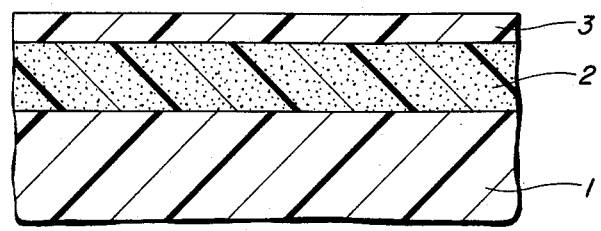
FIG. 1A is a cross-section of a photopolymerizable element useful in the process of this invention.

In accordance with this invention, there is provided a process for the preparation of a dot-etched photopolymerizable lithographic film which comprises (a) exposing imagewise to actinic radiation a photopolymerizable element consisting essentially of a support bearing, in order, a layer of a caustic soluble photopolymerizable composition, and, optionally, an aqueous soluble overcoat layer, the photopolymerizable layer having dispersed therein a chemically soluble pigment;

(b) developing the exposed element with a caustic solution to form at least one pigmented image area; and (c) treating the developed element with chemical solubilizing agent for the pigment whereby the size and density of the pigmented image area is reduced by diffusion etching of the image.

The invention is based on the discovery of the process of reducing exposed and developed areas (especially halftone dots) of a photopolymerizable element and that photopolymerizable elements usable in this process can be obtained using a single caustic soluble photopolymerizable layer containing chemically soluble pigment dispersed therein. The photopolymerizable layer is thin, ranging in dry thickness from 0.0001 to 0.001 inch (0.0025 to 0.025 mm which give good image quality and tonal range). Imagewise exposure to actinic radiation, e.g., in the region 320 to 450 nm, produces hardened areas or dots in the photopolymerizable layer corresponding to the transparent areas of the stencil, mask or process transparency through which the element is exposed. Development of the elements after exposure is by washout of unexposed areas down to the base with a caustic solution for the unexposed areas. The developed element containing polymerized hardened areas or dots is treated with a solubilizing agent for the pigment dispersed therein described more fully below. By means of diffusion etching of the polymerized image, both the size and the density of the pigmented image is reduced without substantially removing the polymerized hardened area or dot, i.e., without substantially affecting the thickness of the photopolymer layer.

While compositions prepared according to the present invention can be processed by hand by washing and rinsing with water and caustic solutions, a preferred method is to pass them through an automatic processing machine where the temperature and spray pattern of the processing solutions can be regulated. Also within a machine the speed of advance can be regulated so that a thicker film can be passed through at a slower rate in order to allow a larger amount of polymer to be adequately removed. A first section of such a machine can spray a film to wash off a water soluble protective overcoat. A second section can spray a film with a mild caustic solution to solubilize polymer in the unexposed areas of the film. A third section can spray the film to remove the solubilized polymer and produce an image using either hot or cold water.

The photopolymerizable element useful in the inventive process is a dry single caustic soluble photopolymerizable layer on a support, the photopolymerizable layer having dispersed therein a chemically soluble pigment to provide an optical density in the actinic region of at least 2.5. Optionally, but preferably, a thin layer of an aqueous soluble overcoat layer is present on the photopolymerizable layer.

The caustic soluble photopolymerizable composition used to form the dry photopolymerizable layer is prepared from (a) 3 to 97 parts by weight of at least one ethylenically unsaturated compound having at least one terminal ethylenic group, preferably at least two such terminal ethylenic groups;

(b) 97 to 3 parts by weight of a polymeric binder soluble in caustic solution; and (c) 0.1 to 10 parts by weight of a free radical generating addition polymerization photoinitiator or initiator system wherein two or more compounds make up the initiator system.

Other components can be present in the photopolymerization composition as is known to those skilled in the art, e.g., polymerization inhibitor, plasticizer, antihalation compounds, optical brightening agents, etc.

Suitable monomers useful in the photopolymerizable compositions include those described in U.S. Pat. Nos. 2,760,863; 2,791,504; 2,927,022; 3,261,686 and 3,380,831. Monomers which can be used as the sole monomer or in combination with others include: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylol propane triacrylate, pentaerythritol triacrylate, polyoxyethylated trimethylol propane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl)ether of bisphenol-A, di-(3-acryloxy-2-hydroxypropyl)ether of bisphenol-A, di-(2-acryloxyethyl)ether of bisphenol-A, di-(3-methacryloxy-2-hydroxypropyl)ether of tetrachloro-bisphenol-A, di-(2-methacryloxyethyl)ether of tetrachloro-bisphenol-A, di-(3-methacryloxy-2-hydroxypropyl)ether of tetrabromo-bisphenol-A, di-(2-methacryloxyethyl)ether of tetrabromo-bisphenol-A, di-(3-methacryloxy-2-hydroxypropyl)ether of 1,4-butanediol, di-(3-methacryloxy-2-hydroxypropyl)ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, trimethylol propane ethoxylate triacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

Polymeric organic binders that are soluble in caustic solution (solely aqueous alkaline solvent devoid of organic solvents) are vinyl addition polymers containing free carboxylic acid groups which are prepared from 30 to 94 mole percent of one or more alkyl acrylates and 70 to 6 mole percent of one or more alpha-beta-ethylenically unsaturated carboxylic acids. Suitable alkyl acrylates for use in preparing these polymeric binders include methyl acrylate, ethyl acrylate, propyl acrylate, butyl acrylate, methyl methacrylate, ethyl methacrylate, butyl methacrylate, etc. Suitable alpha-beta-ethylenically unsaturated carboxylic acids include acrylic acid, methacrylic acid and the like. Binders of this type, including their preparation, are described in German Application OS No. 2,320,849, published Nov. 8, 1973. Other useful binders are of the amphoteric type which are interpolymers comprising a basic component, an acidic component and an acrylic or methacrylic component. Preferred amphoteric interpolymers are those containing from about 30–60% of the N-substituted acrylamide or methacrylamide, from 10–20% of an acidic comonomer and up to 55% of at least one copolymerizable comonomer; e.g., 35–45% N-t-octyl acrylamide, 12–18% acrylic or methacrylic acid, 32–38% methylmethacrylate, 2–10% hydroxypropyl acrylate, and 2–10% alkyl ($C_1$–$C_4$) amino alkyl ($C_2$–$C_1$) acrylate or methacrylate. Preparation of acrylic interpolymers is described in U.S. Pat. No. 3,927,199. Use of such amphoteric interpolymers is described in U.S. Pat. No. 4,293,635 for a photopolymer composition. Acidic binders can also be obtained by selecting a preformed, compatible macromolecular polymeric binding agent which is a copolymer of (1) a styrene-type of a vinyl monomer and (2) an unsaturated carboxyl-containing monomer, as described in British Pat. No. 1,361,298.

Suitable photoinitiators or initiator systems include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acryloin ethers, e.g., benzoin methyl and ethyl ethers; alpha-hydrocarbon-substituted aromatic acyloins, including alpha-methylbenzoin, alpha-allylbenzoin and alpha-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos. 3,427,161; 3,479,185; and 3,549,367 can be used as initiators. Also useful with photoinitiators and photoinhibitors are sensitizers disclosed in Dueber U.S. Pat. No. 4,162,162.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibition are the nitroso compositions disclosed in Pazos U.S. Pat. No. 4,168,982.

In addition to the binder, monomer and initiator, the photopolymer composition may contain other additives such as known plasticizers, dyes, pigments, optical brightening agents, adhesive aids, fillers, antihalation compounds, etc.

Dispersed in the photopolymerizable layers during the preparation of the photopolymerizable compositions, e.g., as shown in the example below or as known to those skilled in the art, are chemically soluble pigments to provide an optical density in the actinic region of at least 2.5. Suitable chemically soluble pigments include: iron oxide, zinc oxide, iron, copper, cupric oxide, aluminum, nickel, brass, bronze, silver, etc. Based on the weight of the dry photopolymerizable layer, the pigment can be present in a range of 25 to 75% by weight, preferably 35 to 55% by weight.

The photopolymerizable composition is present or adhered on films composed of high polymers which are cast as films from molten polymer, such as polyamides, e.g., polyhexamethylene sebacamide, polyhexamethylene adipamide; polyolefins, e.g., polypropylene; polyesters, e.g., polyethylene terephthalate, polyethylene terephthalate/isophthalate; vinyl polymers, e.g., vinyl acetals, vinylidene chloride/vinyl chloride copolymers, polystyrene, polyacrylonitrile; and cellulosics, e.g., cellulose acetate, cellulose acetate/butyrate, cellophane. A particularly preferred support material is polyethylene terephthalate film of the kind described in Alles et al., U.S. Pat. No. 2,627,088 and Alles, U.S. Pat. No. 2,779,684, with or without the surface coating described in the former patent. The support may have a resin "sub" or other layer thereon which may or may not be soluble and which for purposes of this invention is considered part of the support. However, the total thickness of the photopolymerizable layer and any soluble sub or underlayer should not exceed 0.003 inch (0.075 mm). By "soluble" is meant solubility in a solvent in which the photopolymerizable layer is developable. Preferred soluble sub layers have a thickness not exceeding about 0.0002 inch (0.005 mm). Where the particular application does not require that the base support be transparent, the photopolymerizable composition may usefully be coated on an opaque support, such as paper, especially water-proof photographic paper; thin metal sheets, especially aluminum and copper sheets, cardboard and the like.

The optional, but preferred, overcoat layer present on the side of the photopolymerizable layer opposite the support is an aqueous soluble layer. Preferably the overcoat is soluble in the caustic solution in which the photopolymerizable composition is soluble. The overcoat layer can be soluble in water alone. Suitable overcoat layers are described in Alles U.S. Pat. No. 3,458,311, e.g., polyvinyl alcohol and its partial esters, ethers and acetals that contain a substantial amount of unsubstituted vinyl alcohol units so that they have the requisite solubility in water. Suitable polymers include 88% to 99% hydrolyzed polyvinyl acetate. Other useful polymers include gelatin, gum arabic, methyl vinyl ether/maleic anhydride copolymers, polyvinyl pyrrolidones, and mixtures of these polymers.

The photopolymerizable element as described above is imagewise exposed, e.g., for about 5 seconds to about 5 minutes, through a suitable phototool, mask or transparency, e.g., a halftone dot image, to a source of actinic radiation which polymerizes the photopolymerizable layer in the areas beneath the clear image areas. The actinic radiation sources must transmit radiation in the actinic region that the free radical producing initiator is sensitive. Suitable sources include those rich in ultraviolet radiation, e.g., those disclosed in Plambeck, U.S. Pat. No. 2,760,863, Chu and Cohen, U.S. Pat. No. 3,649,268, Peiffer U.S. Pat. No. 4,157,407 and Haney and Lott, U.S. Pat. No. 4,411,980, the disclosures of which are incorporated by reference.

The exposed photopolymerized element is developed by treating the element with a caustic solution normally for about 0.125 to about 5 minutes to remove all the unexposed areas down the support. The element can be placed in the caustic solution and agitation applied or the solution can be applied by spraying, brushing or rubbing onto the surface. Suitable caustic solutions include: hydroxides, carbonates, acetates, ammonia, etc. The developer solution can be heated, e.g., to about 40° C., but this is not necessary.

The developed element is then treated with a chemical solubilizing agent for the pigment which does not affect the photopolymerized layer but by diffusion into the layer etches away the pigment whereby the size and density of the pigmented image areas are reduced. The extent of the diffusion etching is easily controlled by treating the element with water. The particular pigment dispersed in the photopolymerizable layer determines the type of solubilizing agent that may be used. Suitable solubilizing agents for iron compounds include hydrochloric acid, oxalic acid, ethylenediaminetetraacetic acid, etc. Suitable solubilizing agents for silver include dichromate salts, ferricyanide salts, ferric chloride, etc. A suitable basic solubilizing agent for aluminum is hydroxide, whereas copper containing pigments can be solubilized with ammonia. Zinc salts can be solubilized with thiosulfate or thiocyanide. Specific solubilizing agents are taken from the group consisting of $K_2Fe(CN)_6$, $FeCl_3$, $Na_2S_2O_3$, KCNS, KOH, HCl, $NH_3$, oxalic acid, and ethylenediaminetetraacetic acid. The pigment may be solubilized by the formation of a complex or chelate to perform the etching process. The developed element can be placed in the solubilizing agent or the solubilizing agent can be applied by brushing, spraying, etc. localized areas. The period of treatment with the solubilizing agent depends on various factors including the agent used, the dispersed pigment present and the desired amount of reduction of the image or dot. A preferred embodiment is described in Example 1 below.

INDUSTRIAL APPLICABILITY

The dot-etched photopolymer lithographic film prepared by the inventive process is useful in lithographic plate making, wherein a mask of the invention is one of a plurality of color separation masks. The size of the exposed area (dots) is carried out to an extent whereby a composite color image produced with the masks (on a lithographic plate or on a proofing film) has the same tonal balance as the original color image. The elements prepared by the inventive process are capable of functioning in the aforementioned process, thereby providing a new and improved replacement for silver halide litho masks.

In use, a printer desiring to prepare full color prints of a process transparency would expose the yellow photomask of this invention to a halftone image of the yellow component of the process transparency, the magenta photomask to the magenta component, the cyan photomask to the cyan component, and, usually, a black photomask to the gray-to-black component. After exposure and development, the imaged masks would be assembled, one on top of the other in register, to yield a full color proof of the original, e.g., when viewed with transmitted light. If the color reproduction was satisfactory, each imaged photomask would be used for exposing a positive-working photosensitive printing plate, which when processed and inked with an ink corresponding in color to the color of the photomask, would yield prints of that color. Multiple printing from plates exposed through each of the yellow, magenta, cyan, and black imaged masks, and inked accordingly, would yield a faithfully reproduced full-color print of the original process transparency.

At other times, when the color-coded above described imaged photomasks have been assembled for proofing, it may be observed that the full color proof is, for example, too yellow, or too red, etc., either overall or in certain regions. In this instance, the imaged photomask corresponding to the excess color would be corrected by dot-etching, either overall or locally. After dot-etching, the imaged photomasks would be reassembled and inspected again. Further corrections may be necessary, and they would be made until the assembled masks gave the full-color reproduction desired. When satisfactory, each mask would then be used to expose a photosensitive printing plate.

EXAMPLES

The following examples illustrate the invention wherein the percentages are by weight. The molecular weights of polymeric compounds are weight average molecular weights ($\overline{M}w$). The $\overline{M}w$ of the polymers can be determined by using a light scattering technique using known standard samples, e.g., polystyrene, polymethacrylic acid, polymethylmethacrylate, etc., as known to those skilled in the art.

EXAMPLE I

An aqueous polymer composition (A) was prepared as follows:

| | |
|---|---|
| Ammonia (28%) | 4.5 ml. |
| Water | 250.0 ml. |
| Amphoteric interpolymer formed from 40% N—t-octyl acrylamide, 34% methylmethacrylate, 16% acrylic acid, 6% hydroxy propyl methacrylate and 4% t-butyl amino ethyl methacrylate, $\overline{M}w$ ca. 50,000 | 18.9 g |
| Methylmethacrylate/ethylmethacrylate/ acrylic acid terpolymer. Acid No. 100, $\overline{M}w$ 200,000, Tg 70° C., Carboset ® 526, B. F. Goodrich, Akron, Ohio | 1.1 g |

The ammonia and water were combined and the amphoteric interpolymer powder slowly stirred into the liquid to swell and finally dissolve. The terpolymer was then added and allowed to dissolve. Finally 1.0 g of octylphenoxypolyethoxyethanol surfactant was added.

An organic solvent composition (B) was prepared as follows:

| | |
|---|---|
| Methylene chloride | 30.0 g |
| Triethylene glycol dimethacrylate | 9.2 g |
| Benzophenone | 2.6 g |
| 2,2'-bis(o-chlorophenyl)-4,4', 5,5'-tetraphenylbiimidazole | 1.1 g |
| Michler's ketone | 0.3 g |
| 2-Mercaptobenzoxazole | 0.5 g |

The solvent (B) and aqueous (A) compositions were then blended by a high speed mixer to form a photopolymer composition (C).

A mixed iron pigment solution was prepared as follows:

| | |
|---|---|
| Ferrous chloride | 4 g |
| Ferric chloride | 14 g |
| Water | 100 ml |

These were combined in a container placed in a water bath at 40° C.

| | |
|---|---|
| Dilute ammonia was prepared using Ammonia (28%) | 25 ml |
| Water | 750 ml |

The dilute ammonia was stirred into the iron pigment solution at 40° C. to yield a black precipitate. The reaction mixture was filtered to obtain a wet cake of black pigment.

The black pigment was ball milled with the photopolymer composition (C) until a uniform mixture was obtained. The pigmented photopolymer composition (2 of FIG. 1A) was coated onto a polyethylene terephthalate support (1 of FIG. 1A). When dry, the pigmented photopolymer layer which was ~0.0002 inch (0.005 mm) thick was overcoated with a polyvinyl alcohol oxygen barrier layer 0.00008 inch (~0.002 mm) thick (3 of FIG. 1A) to produce a photopolymer element.

Figure 1B:
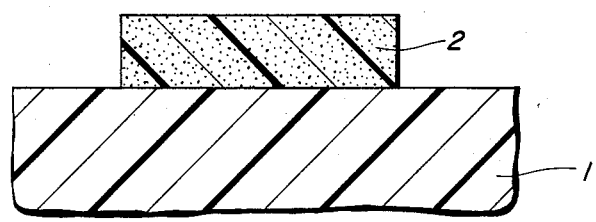
FIG. 1B is a cross-section of the photopolymerizable element of FIG. 1A after imagewise exposure and liquid development.

The photopolymer element was imagewise exposed through a target with a Pulsed Xenon Arc at 4 kw for 30 seconds at a distance of 46 cm. The exposed element was processed first in water to remove the water soluble overcoat, next in a 5% sodium carbonate-sodium bicarbonate buffer solution to solubilize the unexposed areas, and finally in water to remove the carbonate and solubilized polymers. The processed element is illustrated in FIG. 1B.

A sample of the processed element was then dot-etched using 5% or 10% hydrochloric acid solution applied with a brush to localized areas. The higher acid concentration etched faster. The dot-etching could be stopped by washing with water to remove the acid.

The rate of etching with the 5 and 10% hydrochloric acid could be increased with the following additions to the acids:

| | |
|---|---|
| Hydroxylamine hydrochloride | 1.5% |
| Sodium fluoride | 1.0% |
| Stannous chloride | 1.0% |

Figure 1C:
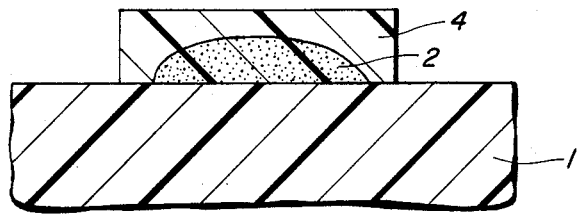
FIG. 1C is a cross-section of the element of FIG. 1B after being dot-etched according to the invention.

With or without the rate increase, the iron oxide was observed to dissolve uniformly from the top and sides of the dots with resulting density loss. The dot-etched element is illustrated in FIG. 1C.

EXAMPLE 2

A photopolymer composition was prepared by combining the following water and organic phases as described in Example 1.

| | | |
|---|---|---|
| Aqueous Phase | | |
| Ammonia (28%) | 3.5 | ml |
| Water | 188.0 | ml |
| Amphoteric interpolymer (Example 1) | 14.2 | g |
| Terpolymer (Example 1) | 1.1 | g |
| Octyl phenoxy polyethoxy ethanol | 0.8 | g |
| Organic Phase | | |
| Methylene chloride | 23.0 | g |
| Triethylene glycol dimethacrylate | 6.9 | g |
| Trimethylol propane triacrylate | 6.9 | g |
| Benzophenone | 2.0 | g |
| 2,2'-bis(o-chlorophenyl)-4,4', 5,5'-tetraphenylbiimidazole | 0.8 | g |
| Michler's ketone | 0.2 | g |
| 2-mercaptobenzoxazole | 0.4 | g |

After blending the two phases for 10 minutes, the following pigment and surfactant additions were made:

| | |
|---|---|
| Zinc oxide, dry process powder from Fisher Scientific Co., Easton, PA | 35.0 g |
| Polystabil V 6596 (VZ) from Stockhausen, anionic polyelectrolyte dispersant distributed by Mobay Chemicals, Pittsburgh, PA | 0.5 g |

The photopolymer composition formed was ball milled overnight. The photopolymer composition was coated with 0.004 inch (0.10 mm) doctor knife and overcoated as described in Example 1.

A photopolymerizable element was imagewise exposed through a target with a Pulsed Xenon Arc at 4 kw for 60 seconds at a distance of 46 cm and processed as described in Example 1. The resultant images were negative white opaque images of the original targets.

Samples were then placed in a standard sodium thiosulfate photographic film fixer for a period of about 1 hour. The zinc oxide became slightly soluble in the fixer resulting in dot-etching by solubilization of only the zinc oxide, leaving behind the polymer. The zinc oxide dissolved uniformly from the top and sides of the dots with resulting density loss.

I claim:

1. A process for the preparation of a dot-etched photopolymerizable lithographic film which comprises
   (a) exposing imagewise to actinic radiation a photopolymerizable element consisting essentially of a support bearing a layer of a caustic soluble photopolymerizable composition having dispersed therein a chemically soluble pigment;
   (b) developing the exposed element with a caustic solution to form at least one pigmented image area; and
   (c) treating the developed element with a chemical solubilizing agent for the pigment whereby the size and density of the pigmented area is reduced by diffusion etching of the image.

2. A process according to claim 1 wherein the chemically soluble pigment is iron oxide.

3. A process according to claim 1 wherein the chemically soluble pigment is zinc oxide.

4. A process according to claim 1 wherein the photopolymerizable element is overcoated with an aqueous soluble layer.

5. A process according to claim 4 wherein the aqueous soluble layer is polyvinyl alcohol.

6. A process according to claim 1 wherein the developed element is treated in step (c) with an acid solubilizing agent.

7. A process according to claim 6 wherein the acid solubilizing agent is hydrochloric acid.

8. A process according to claim 1 wherein the developed element is treated in step (c) with a neutral solubilizing agent.

9. A process according to claim 8 wherein the solubilizing agent is sodium thiosulfate.

10. A process according to claim 1 wherein the developed element is treated in step (c) with a hydroxide compound or ammonia.

* * * * *